United States Patent [19]

Doellner

[11] 4,090,359
[45] May 23, 1978

[54] RADIANT ENERGY POWER SOURCE FOR JET AIRCRAFT AND MISSILES

[76] Inventor: Oscar Leonard Doellner, 4426 E. 22nd St., Tucson, Ariz. 85711

[21] Appl. No.: 694,719

[22] Filed: Jun. 10, 1976

[51] Int. Cl.$^2$ ............................ F02G 1/00; H01L 31/04
[52] U.S. Cl. ................................. 60/39.69 R; 60/264; 136/89 PC; 136/89 AC; 244/173
[58] Field of Search ............ 136/89 P, 89 PC, 89 AC; 244/173; 60/39.09 R, 39.69, 264

[56] References Cited

U.S. PATENT DOCUMENTS

| 3,161,375 | 12/1964 | Ruhge | 244/14 |
|---|---|---|---|
| 3,504,490 | 4/1970 | Klamm | 60/39.09 R |
| 3,811,181 | 5/1974 | Leinkram et al. | 29/572 |
| 3,833,425 | 9/1974 | Leinkram et al. | 136/89 |
| 3,943,726 | 3/1976 | Miller | 62/2 |

Primary Examiner—John H. Mack
Assistant Examiner—Aaron Weisstuch
Attorney, Agent, or Firm—J. Michael McClanahan

[57] ABSTRACT

A radiant-energy-sensing power system applicable to aircraft having jet-type engines, vehicles having gas turbine engines, and missiles, comprising photovoltaic type cells mounted in the proximity of the combustion chamber of a jet engine and the aft end of a missile whereby the photovoltaic solar cells receive a portion of the radiant energy from the burning of the jet or missile fuel and convert same to electrical energy for use in the aircraft, missile, or vehicle.

27 Claims, 5 Drawing Figures

RADIANT ENERGY POWER SOURCE FOR JET AIRCRAFT AND MISSILES

BACKGROUND OF THE INVENTION

Presently, the electrical power system in a jet aircraft consists of a plurality of electrical power generation alternators which may be mechanically connected to the main compressor shaft of the jet engine or may be driven by an auxillary gas turbine engine. The larger jet aircraft, such as the Boeing 747, contain in addition to the main generators mechanically connected to the jet engines, auxiliary power generators which are driven by a separate gas turbine engine.

In these conventional type of power generation means, it is necessary to air cool the generators since under normal conditions the power output is considerable and the heat loss incident to mechanical generation means does require cooling.

Of necessity, the conventional electrical power generation means aboard a jet aircraft are bulky, heavy and occupy precious space. Obviously also there is the need for maintenance as the generators are mechanical systems rotating usually at high speeds, i.e., 6,000 RPM or greater, and do suffer the usual problems associated with rotating mechanical devices. In addition, the aforementioned generators consume engine power and fuel.

In missiles, the power generation system comprises so-called squib-activated batteries which comprise high energy, compact, and short life units. This is entirely compatible with the missile system as the active life span of a missile is a relatively short period of time. However, the battery power system aboard the missile does suffer shortcomings as its being a relatively heavy unit means that the rocket propulsion system must lift the batteries along with the missile, which requires precious fuel.

SUMMARY OF THE INVENTION

The present invention comprises radiant-energy-sensing photovoltaic cells which are mounted in proximity to the combustion chamber of the jet engine of an aircraft or the missile plume of a rocket engine. In the case of a jet engine, the photovoltaic cells are mounted on the exterior of the jet engine casing surrounding the combustion chamber, where means have been provided to permit the radiant energy to pass a window installed in the casing, nominally quartz, to the photovoltaic cells.

Similarly, in the related missile application, the photovoltaic cells are mounted upon the aft portion of the rocket where the energy radiated by the plume from the rocket falls upon the cells generating the electrical power.

Means are provided in the jet engine application for cooling the photovoltaic cells by air passage on the outside of the engine casing and also between the combustion chamber and the outer casing. The photovoltaic cells are located such that there is minimal thermal connection with the jet engine casing. Additionally, reflective means may be provided upon the photovoltaic cell surfaces to reflect that radiant energy which falls outside the spectral response band of the photovoltaic cells.

Accordingly, it is an object of the present invention to provide a means for electrical power generation in a jet-engined aircraft utilizing photovoltaic type cells in proximity to the jet engine combustion chamber.

It is also an object of the present invention to provide a means for electrical power generation in a missile/rocket where photovoltaic cells mounted in proximity of the rocket plume receive radiant energy for conversion to electrical energy.

It is still further an object of the present invention to provide a means for electrical power generation in a vehicle having a gas turbine engine utilizing photovoltaic type cells in proximity to the gas turbine engine combustion chamber.

It is still further an object of the present invention to provide a means of electrical power generation incident to a prime mover having a centralized high-temperature combustion means whereby the prime mover performance is increased and weight of power generation means is reduced.

DETAILED DESCRIPTION

Figure 1:
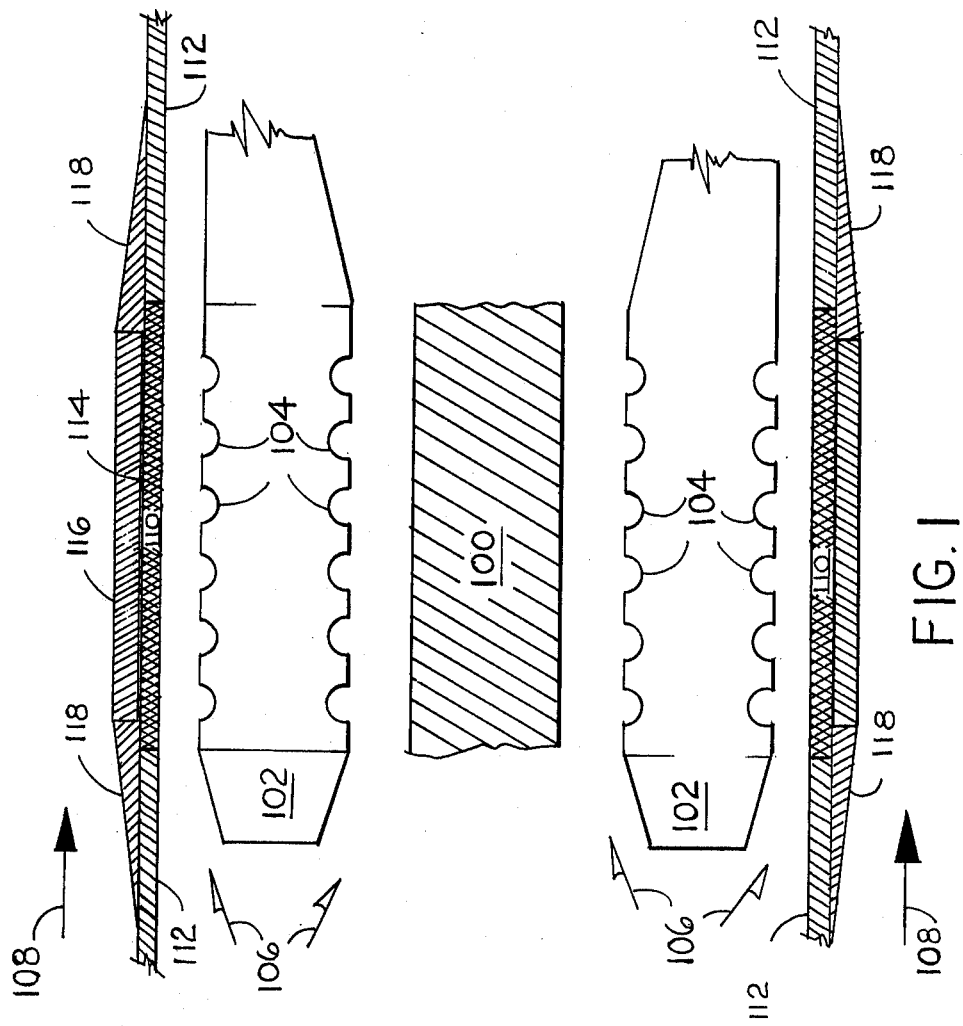
FIG. 1 is a cross-sectional view of a jet engine combustion chamber.

The embodiment of the invention comprises the radiant-energy-sensitive photovoltaic type cells located proximate the combustion chamber of the jet engine. As can be seen in FIG. 1, a quartz window, which is transparent to radiant energy, is located between the source of the radiant energy, i.e., the flame, and the photovoltaic cells.

The physical process which is undergone in the subject invention is described as follows. It is known that the temperatures within the combustion chamber of present jet aircraft range to over 3,500° F (2,200° K). This high operating temperature of the combustion chamber indicates the emission of high levels of normally wasted radiant energy within the combustion chamber. If an assumption is made that the energy radiated is in accordance with that energy radiated from black bodies, the total energy emitted, in accordance with the Stefan-Boltzmann Law, varies as the fourth power of the body's absolute temperature, i.e., $E \alpha T^4$.

In accordance with the Stefan-Boltzmann Law, the total emitted radiation from a black body having a temperature of 2,000° K, is as follows:

Watts Total = $5.6697 \times 10^{-12} T^4$ watts/cm$^2$

Watts Total = $5.67 \times 10^{-12} (2000)^4$ watts/cm$^2$

Watts Total = 90.88 watts/cm$^2$

With the assumptions made above, it is apparent that almost 91 watts/cm$^2$ is generated at the source when the temperature is on the order of 2,000° K.

If the above result is applied to the combustion chambers of present day jet engines such as the turbofan engine utilized in the Boeing 747, where the diameter of the combustion chamber is about 3 feet, its circumference 9.5 feet, and its length 1.5 feet, it is easily seen that 14.25 sq. feet is the approximate area of the radiant source at the perimeter of the combustion chamber. Roughly, this approximates about 13,250 sq. centimeters.

It should be noted that the actual outside surface area of the flames burning the combustion materials is slightly less than the internal walls of the combustion chamber as jet engines are designed such that the burning is centered within the combustion chamber by a blanket of cooling (secondary) air fed to and around the combustion materials through perforations in the combustion chamber liner. This tends to form a heat insulation blanket around the central core of combustion. The diameter of the combustion core will, because of this design, be slightly less than the prior referenced 3 feet.

Thus, from the above indicated annular surface area it would be theoretically possible to extract $1.19 \times 10^6$ watts of radiant power. Note that concentrated radiant energy is available without the use of a concentrator such as concentrating lens, as is frequently necessary in solar photovoltaic power-generation applications.

In accordance with Wien's Displacement Law, the wave-length at which the radiant energy, $\lambda$max, is a maximum is:

$\lambda$max = 2,897.8 $T^{-1}$ microns
$\lambda$max = 1.45 microns (for T = 2000° K)

It is noted that this wavelength is close to the maximum spectral response of gallium arsenide photovoltaic cells. See for instance L. W. James and R. L. Moon, *GaAs Concentrator Solar Cells*, 11th IEEE Photovoltaic Specialists conference, May 1975. It is very possible that future novel photovoltaic material, or multimaterial photovoltaic cells will be able to shift the spectral response of similar photovoltaic-type systems even closer to the 1.45 micron region, while retaining reasonable operating efficiency. See J. A. Merrigan, Sunlight to Electricity, Massachusetts, Institute of Technology Press 1975, p. 78, and M. A. Kettani, *Direct Energy Conversion*, Addison-Wesley Publishing Company, Inc. 1970, p. 273.

Continuing, the radiant energy exitance at the wavelenth of 1.45 microns is obtained from Wien's Displacement Law as follows:

W max = $1.288 \times 10^{-15} T^5$ Watts cm$^{-2}$ micron$^{-1}$
W max = $1.288 \times 10^{-15} (2000)^5$
W max = $1.288 \times 10^{-15} (3.2 \times 10^{16})$
W max = 41.2 watts/(cm$^2$ micron)

reference being made to the *American Institute of Physics Handbook*, Third Edition, McGraw Hill, 1972, page 6-200.

Figure 2:
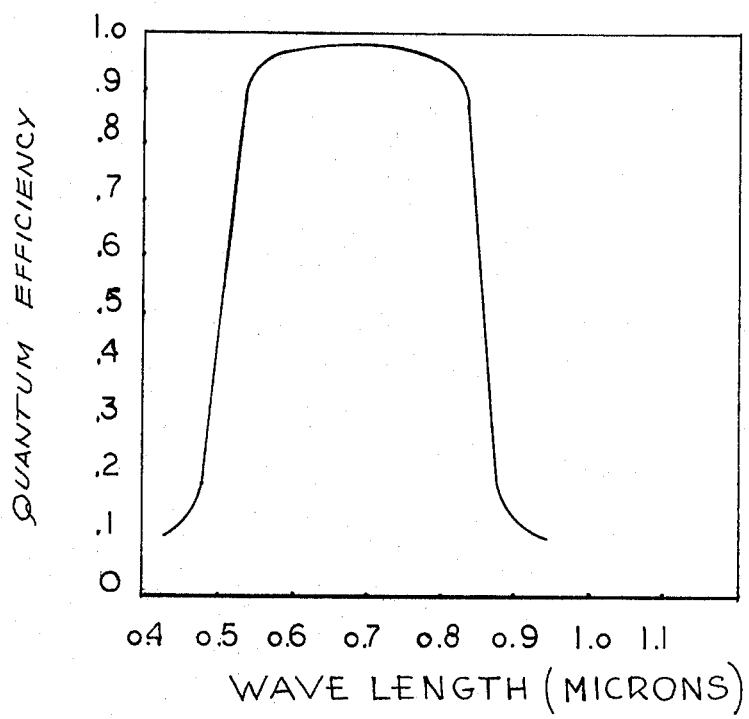
FIG. 2 is a graph of the efficiency vs. energy wavelength received of a gallium arsenide photovoltaic cell.

As can be seen from the example of FIG. 2, the spectral response bandwidth of the gallium arsenide photovoltaic cells is in the region of 0.45 microns to 0.9 microns. In order to determine the amount of radiant power in this wavelength region which would be emitted in our example, the wavelengths are expressed in terms of $\lambda$ max as:

(0.45/1.45) = 0.31

(0.9/1.45) = 0.62

Referring now to W. J. Smith, *Modern Optical Engineering*, McGraw-Hill, 1966, FIG. 8.7 at page 194, approximately four percent (4%) of the total radiation is emitted in the spectral band corresponding to the gallium arsenide photovoltaic cell's band, i.e., about 47,600 watts.

Referring to FIG. 1 specifically, a partial cross-section of a typical turbojet engine is shown (here a General Electric J85) where the central shaft 100 is shown which connects the axial-flow compressor in the forward part of the engine (not shown, but located to the left of shaft 100 in FIG. 1) with the axial-flow turbine in the rear portion of the engine (not shown, but located to the right of shaft 100 in FIG. 1). The combustion chamber inner liner 102, which surrounds the shaft 100 in an annular coaxial ring configuration, is shown with perforations 104. The combustion chamber receives compressed air from the axial-flow compressor which, together with the jet fuel, is burned within the combustion chamber inner liner 102. The reaction products of the burning rush to the right to drive the axial-flow turbine blades (not shown) which drive the central shaft 100, which in turn, drives the axial flow compressor. In the turbojet engine as shown in FIG. 1, air from the outside environment represented by arrows 108 passes over the outside periphery of the outer casing 112 of the engine. The axial-flow compressor additionally supplies air represented by arrows 106 between the combustion chamber inner liner and the inner surface of the casing 112 of engine in addition to the air passing between the combustion chamber inner liner and central shaft 100.

Figure 3:
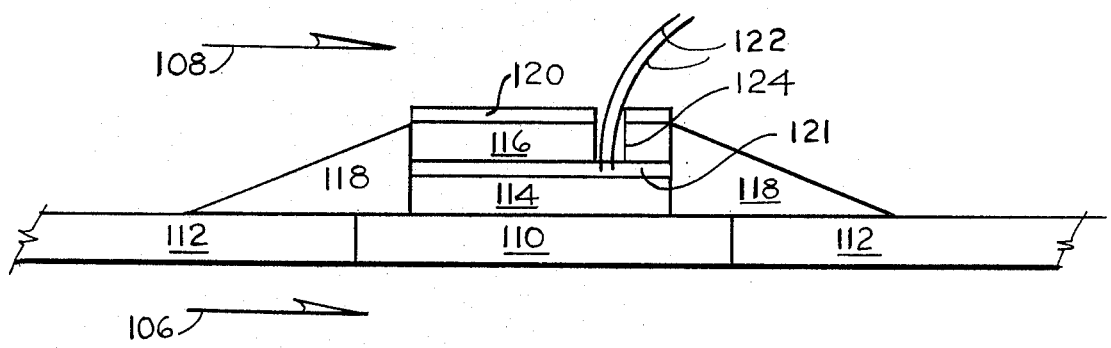
FIG. 3 is a cross-sectional view of the subject invention in place on the casing of the jet engine.

Shown in FIG. 1 and FIG. 3 is the radiant-energy-transparent quartz window 110, which is set into and made a part of the outer casing 112 of the jet engine. It is important to note that radiant-energy-transparent window 110 is a good thermal insulator—this is necessary as the cooling airstream 106 internal to the engine is typically around 450° F. Located adjacent the quartz window 110 are the gallium arsenide photovoltaic cells 114. Photovoltaic cells 114 are thermally isolated from the jet engine casing 112 by thermally insulating structural member 118, nominally fiberglass. Juxtaposed the gallium arsenide cells is a thermally conductive structural member 116 which serves to give thermal mass to the cells and permits the cells to be cooled by the external air. Additionally, the thermal mass of thermally conductive structural member 116 provides a reasonable thermal time constant to minimize transient thermal gradients and resulting stresses in transparent window 110, due to rapid operational thermal variations (e.g., engine starting, in-flight flameouts and restarts). It is obvious that cooling fins 120 could also be added to the thermally conductive structural member 116 for additional cooling. It is noted that the quartz window 110 may or may not comprise a band surrounding the entire annular combustion chamber, the construction of structural member 116 being such that it has a similar coefficient of thermal expansion as does quartz window 110 and is such that it does not destroy that strength integrity of the outer casing 112. The metal trademarked "Invar" may be utilized for structural member 116. Window 110 may be made of radiant energy transparent materials other than quartz providing these materials have similar thermal coefficients of expansion with neighboring structural member 116 and that they fulfill necessary strength, temperature, abrasion, and thermal shock requirements, as for example, trademark "Pyrex" glass, or trademark "Vycor" glass (nominally 96% silicon dioxide).

With reference to FIG. 3, the gallium arsenide photovoltaic cells 114 are thermally bonded to thermally conductive structural member 116 by electrically insulating, thermally conducting materials 121, such as beryllium oxide and/or resilient bonding adhesive. The cells and their backing, thermally conductive structural member 116, form a thermal island. This thermal island is kept cool by copious amounts of external ambient cooling air while the plane is in flight. Inasmuch as jet aircraft require only a very brief, if any at all, pre-flight warm-up time, the only time that heat would be a problem is during this brief period of ground checkout time. For turbojets, an actuator controlled bleed valve could bypass bleed air from the first stage compressors to cool the cells during ground checkout (the bleed valve would be closed for operational flight). Turboshafts would use a continuous stream of this bleed air for cooling. Turboshaft-type engines are the type that are commonly used in helicopters and motor vehicles. Note that turboprop- and turbofan-type jet engines have obviated the heating problem inasmuch as these engines will be drawing external cooling air over the thermally conductive structural member 116. Also shown in FIG. 3 are electrical leads 122 for withdrawing electrical power from cells 114, the leads passing through a pressure sealed opening 124 in structural member 116.

The thermally insulating structural member 118 is fastened to the outer casing of the jet engine 112 by bonding or by mechanical fastening means such as rivets or other similar means (not shown).

While the use of air convection cooling and thermal isolation techniques are illustrated, these techniques are not limiting. Other cooling means may be employed, as for example, a circulation water-cooled jacket attached to or incorporated within the thermally conductive structural member 116. Another method would be ambient-air-cooled heat sinks thermally connected to the photovoltaic cells (especially when using photovoltaic cells near the axial side of coaxial liner 102) via heat pipes.

It is noted that in the present configuration, the photovoltaic cells can be located within a very close range, i.e., one to two inches of the radiant source, yet may be conveniently cooled by the method described above. A very desirable feature of this method (as well as heat-pipe methods), is that at moderate to high flight altitudes, i.e., the majority of the flight period, the photovoltaic cells are naturally refrigeration-cooled due to the low ambient-air temperature ($-50°$ F) at high altitudes. This is important as it is always desirable to keep photovoltaic cell temperatures as low as possible for most efficient operation (see M. A. Kettani, *Direct Energy Conversion*, Addison-Wesley Publishing Company, Inc., 1970, p. 270). Lower photovoltaic cell operating temperatures may allow efficient operation with silicon concentrator-type photovoltaic cells (e.g., Zh. I. Alferov, V. M. Andreev, M. B. Kagan, I. I. Protasov, and V. G. Trofim, *Sov. Phys. Semicond.* 4, p. 2047, 1971). This would extend the spectral response to 1.1 micron, i.e., closer to $\lambda$ max = 1.45 micron mentioned previously.

In the preferred embodiment, heterojunction-type photovoltaic cells are employed. Heterojunction photovoltaic cells have efficiency advantages over homojunction cells. The improved efficiencies compared to conventional homojunction cells are generally attributed to the reduction of series resistance and the reduction of surface recombination losses, see J. M. Woodall and H. J. Hovel, *Applied Physics Letters*, Vol. 21, 1972, p. 379.

Series resistance is a critical consideration for concentrator cells as it is a factor which ultimately limits the degree of concentration which can be used. Low series resistance silicon cells can be made using vertical multijunction techniques, see R. K. Smeltzer, D. L. Kendall, G. L. Varnell, *Conference Record of the Tenth IEEE Photovoltaic Specialists Conference* (IEEE, New York, 1973) p. 194. Construction procedures for building low series resistance aluminum GaAs/GaAs heterojunction cells are given in, for example, L. W. James and R. L. Moon, *GaAs Concentrator Solar Cells*, Conference Record of the Eleventh IEEE Photovoltaic Specialists Conference, May 1975, p. 402.

As is presently within the state-of-the-art in photovoltaic cell technology, a thin film coating may be placed upon the surface of the gallium arsenide photovoltaic cells to reflect a substantial percent of the radiant energy present thereon which is not within the spectral response of the cells, i.e., radiant energy having wavelengths less than 0.45 microns and greater than 0.90 microns. By placing, for example, the thin film coating at the photovoltaic cell/transparent cover-plate (quartz window 110) interface, large amounts of radiant energy is prevented from reaching and unnecessarily heating the photovoltaic cells, while still allowing minimum reflection losses at the useful spectral distribution of the source (combustion flame). The refractive indexes for the photovoltaic cells and quartz window are typically 3.5 and 1.5 respectively; large Fresnel reflections normally occur at such large mismatches (without coatings). See for example, Georg Hass and Rudolf E. Thun, *Physics of Thin Films*, Academic Press, New York, 1964 and H. A. Macleod, *Thin-Film Optical Filters*, American Elsevier Publishing Company, Inc., New York, 1969.

Proceeding on, the output power P of the photovoltaic cells in watts per square centimeter of active cell area, assuming for simplicity that there is no loss in radiant transfer between the jet engine combustion chamber flame and the photovoltaic cells, and that the irradiance is perpendicular to and constant over the surface area of the photovoltaic cells, is given by:

$$P = \int_{\lambda_1}^{\lambda_2} V(\lambda) E(\lambda) d\lambda$$

where E $(\lambda)$ is the spectral exitance distribution in watts $cm^{-2}$ micron $^{-1}$ of the combustion chamber flame, V $(\lambda)$ is the normalized spectral energy efficiency of the photovoltaic cells at a given cell operating temperature (determined mainly by the previously discussed cell cooling system), and $\lambda 1$ to $\lambda 2$ contain the wavelength interval of interest (i.e., the spectral bandwidth of the photovoltaic cells). Both $V(\lambda)$ and $E(\lambda)$ may be empirically determined. The equation above is solved by graphical or numerical integration as mathematical expressions for $V(\lambda)$ and $E(\lambda)$ normally do not exist. For a more complete discussion, see W. J. Smith, *Modern Optical Engineering*, McGraw-Hill, 1966, pages 192–193.

Further, in determining the amount of power which may be obtained, the energy radiated upon the photovoltaic cell is further reduced by the portions of the combustion chamber inner liner 102 which tend to shield the photovoltaic cell, i.e., the radiant energy must pass through the perforations 104 of the combustion chamber inner liner to the photovoltaic cells. It is noted however, that there will be a tendency for the radiant energy to saturate the cells and overlap the non-covered areas. This is due primarily to the fact that all the radiant energy emitting from the perforation will not be axial to the perforations as though coming from an imaginary center of the combustion chamber inner liner but, in fact, will be at all angles off of an axial line, although the majority of the radiant energy will be emitted axially. Future technology in quartz or other high temperature transparent materials may well develop a combustion chamber inner liner which will be transparent to the radiant energy in the wavelength response of the photovoltaic cells.

Returning to the example given for the Boeing 747 turbofan engine and with a total photovoltaic cell operating efficiency of 40% within the spectral band, and using conventional metal inner liners where the perforations cover approximately 25% of the total area of the liner, the total available output power would be P out = (0.4)(0.25)(47,600)Watts
P out = 4,760 Watts With the transparent inner liner mentioned above the total available output is:

P out = 0.4 × 47,600
P out = 19,040 Watts

Figure 4:
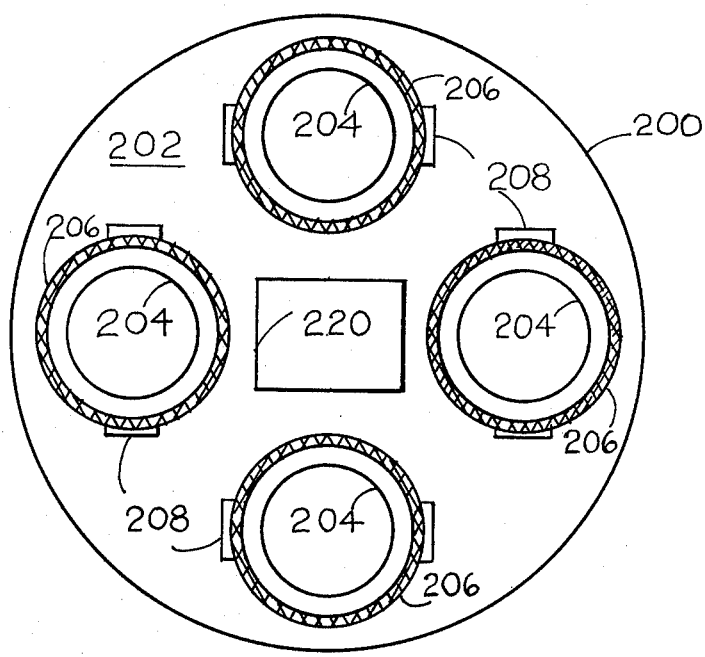
FIG. 4 is the bottom view of a rocket showing the invention placed thereupon.

Reference now to FIG. 4 illustrates the application of the subject invention to rockets and missiles. The view shown in FIG. 4 is a view of the aft end of the missile or missile stage where the flame exhausts through the various engine outlet ports. The rocket outer skin 200 is shown in cross section as a circle attaching the base 202 of the rocket. The four engine outlets 204 are shown in cross section which, through the use of exhaust deflection means such as jetavators 206, which are annular rings coaxial with the engine ports 204 to direct the flame which exits the engine ports 204 in order to propel and direct the rocket. Each jetavator rotates about pivot means (not shown) held in common with standards 208 which are attached to base 202. The jetavators are usually moved by a series of hydraulic pistons (not shown) connected to the jetavator. Thus it can be seen the resultant output flame of the missile can be directed in the direction to steer the missile in accordance with its desired course.

Shown affixed to missile base 202 (or atop housing containing missile electronic equipment) is the subject invention 220 comprising the photovoltaic cells which receive radiant energy from the rocket plume.

In single nozzle exhaust systems, where a single nozzle is built into the center of the aft end of the missile, or missile stage, the photovoltaic cells are located around the perimeter of the base of the nozzle. The radiant energy from the plume radiates upon the cells as in the four engine port configuration delineated above.

Figure 5:
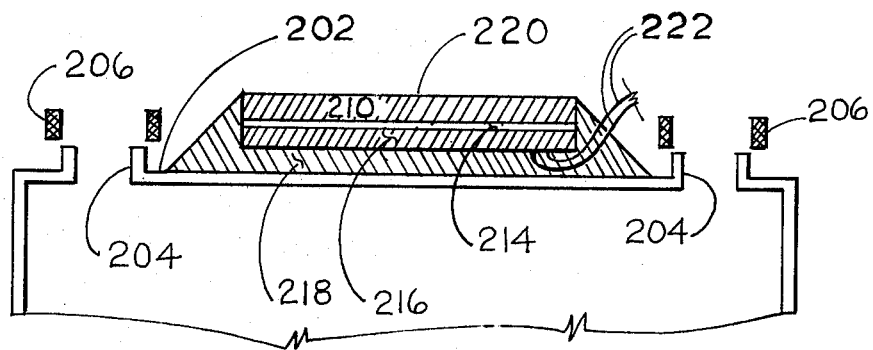
FIG. 5 is a cross-sectional view of the invention in place upon the bottom of the rocket.

FIG. 5 is a cross section view of the subject invention for a missile configuration of FIG. 4 and showing similar construction methods as were employed in the application of jet engines. Resting upon base 202 and attached thereto is thermally insulating structural member 218 which is fastened to base 202 by adhesive bonding or by mechanical fastening means such as rivets or other similar means (not shown). Similarly, as in the case of the application of photovoltaic cells to the jet engine, the photovoltaic cells are of essentially zero mass, have little or no thermal mass and as a consequence, require the utilization of a thermal mass member, which in the case of the jet engine, was cooling member 116; however, in application of the missile configuration, is thermal structural member 216. Thin film coated photovoltaic cells 214 are thermally bonded to thermal mass member 216 and are set into and held by insulating structural member 218 with the radiant energy transparent window 210 mounted atop the photovoltaic cells. In the case where the photovoltaic cells are mounted atop the housing containing the missile electronic equipment, such housing may comprise the thermal mass member. All members are held in place by bonding or other adhesive or mechanical fastening means. Electrical power leads 222 are shown in position in FIG. 5 to withdraw power from the photovoltaic cells through the thermally insultated structural member 218.

Again, as in the application of the invention to the jet engine, the radiant energy transparent window 210 may be made from quartz or high temperature glass such as vycor or pyrex, fulfilling the qualities of strength, thermal expansion and transparency as required. Similarly, thermal insulating structural member 218 may comprise fiberglass or other heat insulating materials which has structural integrity. It is remembered that a rocket engine operates for a relatively short period of time and the power which is generated by the subject invention is only needed for that period of time. Consequently, the heat problems due to conduction through the base wall 202 will not be as critical as in the prior application of long operating-time jet engines.

Radiometric plume measurements made on actual missile launches indicate that the plume at the exit plane (nozzle) of the Saturn V missile radiates as a black body continuum at a temperature of 2600° K. See, for example, Krider, Noggle, Uman, and Orville, *Lightning of the Apollo 17/Saturn V Exhaust Plume*, Journal of Spacecraft, Volume 11, No. 2, page 72. Based upon the measurements given in the above article, the radiant exitance of this missile plume is 259.5 watts/cm$^2$ at a $\lambda$ max of 1.11 micron. See L. Levi, *Applied Optics*, John Wiley, & Sons, Inc., 1968, page 550–552.

Excessive radiation on the photovoltaic cells can be decreased by techniques such as covering the photovoltaic cells or transparent window with a wire screen mesh. This acts as a neutral density filter to radiant energy, and also as an electromagnetic shield to electromagnetic energy for strategic missiles.

Progress in the development of gas turbine jet engines is towards higher and higher operating temperatures, for example the Pratt and Whitney JT 10-D Turbofan, and as such, become more favorable to the utilization of the subject invention.

While the assumption made throughout this specification has been that the jet engine combustion chamber radiant energy emitted is in accordance with perfect black-body principles, it is realized that the effect of non-complete black body emission, is only to reduce the amount of energy radiated, which in turn, will result in less power delivered from the photovoltaic cells. The basic principles and concept of invention still applies, that of deriving useful electrical power from the application of photovoltaic cells in the configurations hereinabove defined.

While a preferred embodiment in two applications have been described, they are intended to cover all modifications and alternate constructions falling within the spirit and the scope of the invention as defined in the appended claims.

I claim:

1. A combined jet engine radiant energy power source comprising radiant energy transparent means proximate the radiant energy source combustion chamber of the jet engine, photovoltaic cell means having a defined spectral response bandwidth juxtaposed said radiant energy transparent means, thermal mass means thermally connected to said photovoltaic cell means; and means holding said radiant energy transparent means, photovoltaic cell means, and thermal mass means proximate the radiant energy source whereby radiated energy from the engine passing through said transparent means falls on said photovoltaic cell means to generate electrical power.

2. The combination as defined in claim 1 wherein said radiant energy transparent means is a thermal insulator located interiorly an opening in the jet engine outer casing.

3. The combination as defined in claim 2 wherein said thermal mass means has similar thermal expansion characteristics as does said radiant energy transparent means.

4. The combination as defined in claim 3 wherein said means holding said radiant energy transparent means, photovoltaic cell means, and thermal mass means is attached to the outside casing of the jet engine.

5. The combination as defined in claim 4, wherein said photovoltaic cell means juxtaposed said radiant energy transparent means is coated with a thin film coating which reflects radiant energy outside the spectral response bandwidth of the photovoltaic cells.

6. The combination as defined in claim 4 wherein said means holding said radiant energy transparent means, said photovoltaic cell means, and said thermal means to said jet engine, casing means comprises fiberglass.

7. The combination as power source for jet aircraft defined in claim 3 wherein the radiant energy transparent means comprises quartz.

8. The combination as defined in claim 7 wherein said thermal mass means comprises invar metal.

9. The combination as defined in claim 3 wherein the radiant energy transparent means comprises pyrex glass.

10. The combination as defined in claim 3 wherein the radiant energy transparent means comprises vycor glass.

11. The combination as defined in claim 3 wherein said thermal mass means comprises air cooled means having fins whereby heat is removed by air passing over said fins.

12. The combination as defined in claim 3 wherein said thermal mass means comprises water cooled means.

13. The combination as as defined in claim 1 wherein said photovoltaic cells comprise gallium arsenide cells.

14. The combination as as defined in claim 1 wherein said photovoltaic cells comprise silicon cells.

15. The combination of claim 1 wherein said jet engine is the jet engine of a jet aircraft.

16. A combined rocket engine and radiant energy power source for missiles comprising radiant energy transparent means proximate the radiant energy source plume of the missile, photovoltaic cell means having a defined spectral response bandwidth juxtaposed said radiant energy transparent means, thermal mass means thermally connected to said photovoltaic cell means; and means holding said radiant energy transparent means, photovoltaic cell means, and thermal mass means proximate the radiant energy source whereby radiated energy from the missile plume passing through said transparent means falls on said photovoltaic cell means to generate electrical power for use in the missile.

17. The combination as defined in claim 16 wherein said radiant energy transparent means is a thermal insulator located on the aft end of the missile.

18. The combination as defined in claim 17 wherein said thermal mass means has similar thermal expansion characteristics as does said radiant energy transparent means.

19. The combination as defined in claim 18 wherein the radiant energy transparent means comprises quartz.

20. The combination defined in claim 18 wherein the radiant energy transparent means comprises pyrex glass.

21. The combination as defined in claim 18 wherein the radiant energy transparent means comprises vycor glass.

22. The combination as defined in claim 17, wherein said photovoltaic cell means juxtaposed said radiant energy transparent means is coated with a thin film coating which reflects radiant energy outside the spectral response bandwidth of the photovoltaic cells.

23. The combination as defined in claim 16 wherein said photovoltaic cells comprises gallium arsenide cells.

24. The combination as defined in claim 16 wherein said photovoltaic cells comprises silicon cells.

25. A combination engine and radiant energy power source comprising an engine including a high temperature combustion means forming a radiant energy source and radiant energy transparent means proximate the radiant energy source formed by the high temperature combustion means, photovoltaic cell means having a defined spectral response bandwidth juxtaposed said radiant energy transparent means, thermal mass means thermally connected to said photovoltaic cell means, and means holding said radiant energy transparent means, photovoltaic cell means and thermal mass means proximate the radiant energy source formed by said combustion means whereby radiated energy from the combustion means passes through said transparent means and is received by said photovoltaic cell means, said photovoltaic cell means being responsive thereto for generating electric power.

26. The combination 25 wherein the engine is a gas turbine.

27. The combination 25 wherein the engine is a jet engine.

* * * * *